US009153190B2

United States Patent
Ahn et al.

(10) Patent No.: US 9,153,190 B2
(45) Date of Patent: Oct. 6, 2015

(54) GATE DRIVER AND DISPLAY APPARATUS HAVING THE SAME

(75) Inventors: Soon-Il Ahn, Cheonan-si (KR); Ho-Kyoon Kwon, Seoul (KR); Byoung-Sun Na, Hwaseong-si (KR); Dong-Hyon Ki, Seoul (KR); Seung-Soo Baek, Seoul (KR); Hye-Seok Na, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 1308 days.

(21) Appl. No.: 12/333,561

(22) Filed: Dec. 12, 2008

(65) Prior Publication Data

US 2010/0007653 A1 Jan. 14, 2010

(30) Foreign Application Priority Data

Jul. 8, 2008 (KR) ................ 10-2008-0066230

(51) Int. Cl.
*G09G 3/36* (2006.01)
*G06F 3/038* (2013.01)
*G11C 19/18* (2006.01)
*G11C 19/28* (2006.01)

(52) U.S. Cl.
CPC ............ *G09G 3/3677* (2013.01); *G11C 19/184* (2013.01); *G11C 19/28* (2013.01); *G09G 2330/08* (2013.01)

(58) Field of Classification Search
CPC .............. G09G 3/3674; G09G 3/3677; G09G 2310/0264; G09G 2310/0286
USPC .................. 345/87, 98–100, 204; 377/64–81; 340/12.21
See application file for complete search history.

(56) References Cited

U.S. PATENT DOCUMENTS

| | | | |
|---|---|---|---|
| 6,362,643 B1* | 3/2002 | Kim ...................... | 324/760.02 |
| 7,203,264 B2* | 4/2007 | Lo et al. .................. | 377/64 |
| 2003/0227433 A1* | 12/2003 | Moon ...................... | 345/100 |
| 2004/0189585 A1* | 9/2004 | Moon ...................... | 345/100 |
| 2005/0275614 A1* | 12/2005 | Kim et al. ............... | 345/100 |
| 2006/0007085 A1* | 1/2006 | Kim et al. ............... | 345/87 |
| 2006/0221043 A1* | 10/2006 | Horibata et al. ........ | 345/100 |
| 2006/0256066 A1* | 11/2006 | Moon ...................... | 345/100 |
| 2007/0001953 A1* | 1/2007 | Jang et al. .............. | 345/88 |
| 2007/0040792 A1* | 2/2007 | Kwag et al. ............. | 345/100 |

FOREIGN PATENT DOCUMENTS

| | | | |
|---|---|---|---|
| CN | 1704804 A | | 12/2005 |
| CN | 1727972 A | | 2/2006 |
| CN | 1838208 A | | 9/2006 |
| JP | 2003150128 A | * | 5/2003 |
| JP | 2004157508 A | | 6/2004 |
| JP | 2004295126 A | | 10/2004 |

(Continued)

*Primary Examiner* — Seokyun Moon
*Assistant Examiner* — Josemarie G Acha, III
(74) *Attorney, Agent, or Firm* — Cantor Colburn LLP (57) ABSTRACT

A gate driver that comprises n shift registers, wherein n is an integer equal to or larger than 1, each of the n shift registers includes; a start stage which outputs a gate signal and starts its operation in response to a start signal, and a plurality of subsequent stages which are connected to each other in sequence, and which sequentially output a plurality of gate signals in response to a signal output from the start stage, wherein at least one stage of the plurality of subsequent stages is reset by the start signal.

21 Claims, 4 Drawing Sheets

(56) References Cited

FOREIGN PATENT DOCUMENTS

| | | |
|---|---|---|
| JP | 2007078717 | 3/2007 |
| JP | 2008003602 A | 1/2008 |
| JP | 2008130139 A | 6/2008 |
| JP | 5452028 B2 | 3/2014 |
| KR | 1020040072131 | 8/2004 |
| KR | 1020050114850 | 12/2005 |
| KR | 1020070074078 | 7/2007 |
| KR | 1020070121071 A | 12/2007 |
| KR | 1020080027620 A | 3/2008 |

* cited by examiner

GATE DRIVER AND DISPLAY APPARATUS HAVING THE SAME

This application claims priority to Korean Patent Application No. 2008-66230, filed on Jul. 8, 2008, and all the benefits accruing therefrom under 35 U.S.C. §119, the contents of which in its entirety are herein incorporated by reference.

BACKGROUND OF THE INVENTION

1. Field of the Invention

The present invention relates to a gate driver and a display apparatus having the same. More particularly, the present invention relates to a gate driver having improved output characteristics and a display apparatus having the gate driver.

2. Description of the Related Art

In general, a liquid crystal display ("LCD") includes an LCD panel that displays an image. The LCD panel includes a lower substrate, an upper substrate facing the lower substrate, and a liquid crystal layer interposed between the lower and upper substrates.

The LCD panel includes a plurality of gate lines, a plurality of data lines, and a plurality of pixels each of which is connected to a corresponding gate line of the plurality of gate lines and a corresponding data line of the plurality of data lines. The LCD panel includes a gate driving circuit that sequentially applies a gate signal to the gate lines. Typically, the gate driving circuit is directly formed on the gate driving circuit through a thin film deposition process.

The gate driving circuit includes a shift register in which a plurality of driving stages are connected to each other, one after another, and sequentially outputs the gate signal. Each driving stage outputs the gate signal to a corresponding gate line of the plurality of gate lines in response to a carry signal applied from a previous stage and applies the carry signal to a subsequent stage.

In addition, each driving stage is turned off by a gate signal applied from the subsequent driving stage, however a method is required to turn off a last driving stage of the driving stages since there are no additional subsequent driving stages to turn off the last stage of the driving stages.

BRIEF SUMMARY OF THE INVENTION

An exemplary embodiment of the present invention provides a gate driver capable of reducing the malfunction of stages thereof.

Another exemplary embodiment of the present invention also provides a display apparatus having the gate driver.

In an exemplary embodiment of the present invention, a gate driver that includes n shift registers, wherein n is a constant number equal to or larger than 1, each of the n shift registers includes; a start stage which outputs a gate signal and starts its operation in response to a start signal, and a plurality of subsequent stages which are connected to each other in sequence, and which sequentially output a plurality of gate signals in response to a signal output from the start stage, wherein at least one stage of the plurality of subsequent stages maybe reset by the start signal.

In another exemplary embodiment of the present invention, a display apparatus includes a display panel which displays an image, the display panel including a plurality of gate lines, a plurality of data lines, and a plurality of pixels respectively connected to the plurality of gate lines and the plurality of data lines, a data driver which applies a data signal to the plurality of data lines, and a gate driver which sequentially applies a gate signal to the plurality of gate lines, wherein the gate driver includes n shift registers, wherein n is an integer equal to or larger than 1, each of the shift registers including; a start stage which outputs a gate signal and starts its operation in response to a start signal, and a plurality of subsequent stages which are connected to each other in sequence, and which sequentially output the gate signal in response to a signal output from the start stage, and wherein at least one stage of the plurality of subsequent stages may be reset by the start signal.

According to the above, the stages of the gate driver are reset by using the start signal, so that the output characteristics of the gate driver may be improved. In addition, the start signal is applied to the reset terminal of each stage using a signal wire through which the start signal is applied to the dummy stage, thereby preventing the need for additional signal wire to be added to the gate driver.

BRIEF DESCRIPTION OF THE DRAWINGS

The above and other advantages of the present invention will become readily apparent by reference to the following detailed description when considered in conjunction with the accompanying drawings wherein.

DETAILED DESCRIPTION OF THE INVENTION

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on to the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

Figure 1:
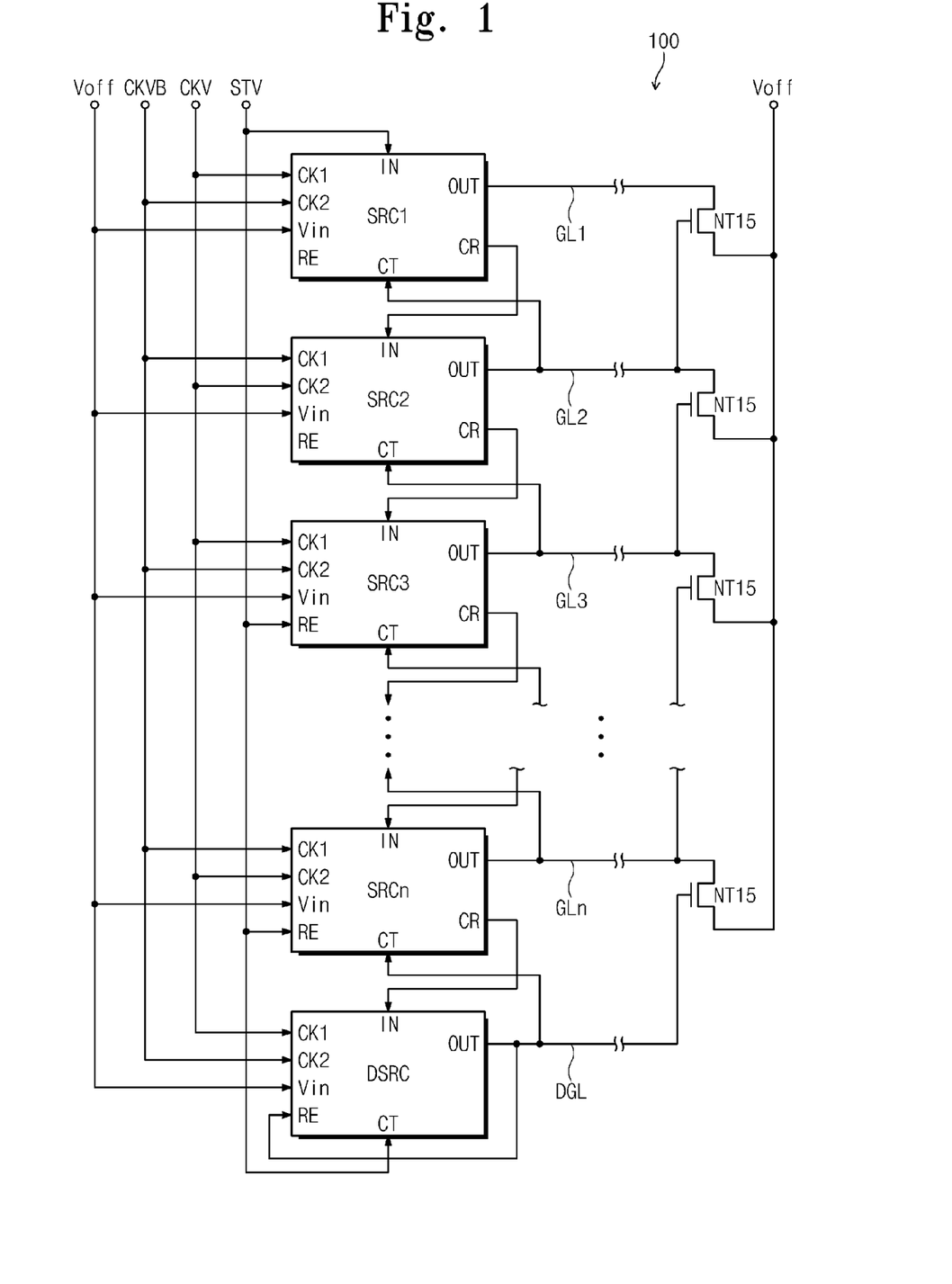
FIG. 1 is a block diagram illustrating an exemplary embodiment of a gate driver according to the present invention.

FIG. 1 is a block diagram illustrating an exemplary embodiment of a gate driver according to the present invention.

Referring to FIG. 1, a gate driver 100 includes a shift register. The shift register includes a plurality of driving stages SRC1~SRCn connected to each other one after another and a dummy stage DSRC. The shift register is located at a position adjacent to first ends of the gate lines GL1~GLn.

Each of the driving stages SRC1~SRCn includes an input terminal IN, a first clock terminal CK1, a second clock terminal CK2, a control terminal CT, a voltage input terminal Vin, a reset terminal RE, an output terminal OUT, and a carry terminal CR. The dummy stage DSRC includes the input terminal IN, the first and second clock terminals CK1 and CK2, respectively, the control terminal CT, the voltage input terminal Vin, and the output terminal OUT.

The input terminal IN of each of the driving stages SRC1~SRCn is electrically connected to the carry terminal CR of a previous driving stage to receive a previous carry signal, with the exception of a first driving stage SRC1. A start signal STV that starts an operation of the gate driver 100 is applied to the input terminal IN of the first driving stage SRC1 (hereinafter, referred to as a start driving stage) of the driving stages SRC1~SRCn in lieu of the previous carry signal. The control terminal CT of each of the driving stages SRC1~SRC(n-1) is electrically connected to the output terminal OUT of a subsequent stage to receive a next gate signal. The control terminal CT of a last driving stage SRCn of the driving stages SRC1~SRCn is electrically connected to the output terminal OUT of the dummy stage DSRC. In the present exemplary embodiment, the start signal STV is applied to the control terminal CT of the dummy stage DSRC in lieu of a gate signal from a subsequent stage.

The first clock terminal CK1 of odd-numbered driving stages SRC1, SRC3, . . . , SRCn-1 of the driving stages SRC1~SRCn receives a first clock CKV, and the second clock terminal CK2 of odd-numbered driving stages SRC1, SRC3, . . . , SRCn-1 of the driving stages SRC1~SRCn receives a second clock CKVB having a phase substantially opposite to the phase of the first clock CKV. The first clock terminal CK1 of even-numbered driving stages SRC2, . . . , SRCn of the driving stages SRC1~SRCn receives the second clock CKVB, and the second clock terminal CK2 of even-numbered driving stages SRC2, . . . , SRCn of the driving stages SRC1~SRCn receives the first clock CKV. In the exemplary embodiment wherein n is an even number, the first and second clock terminals CK1 and CK2 of the dummy stage DSRC receive the first and second clocks CKV and CKVB, respectively.

The voltage input terminal Vin of the driving stages SRC1~SRCn and the dummy stage DSRC receive a gate-off voltage Voff. Exemplary embodiments include configurations wherein the gate-off voltage Voff may be a ground voltage or a negative voltage.

The output terminal OUT of each of the driving stages SRC1~SRCn is electrically connected to a corresponding gate line of the gate lines GL1~GLn. Thus, the driving stages SRC1~SRCn sequentially output the gate signal through the output terminal OUT thereof to apply the gate signal to the gate lines GL1~GLn.

The carry terminal CR of each of the driving stages SRC1~SRC(n-1) is electrically connected to the input terminal IN of the next stage and applies a carry signal to the input terminal IN of the next stage. The carry terminal CR of the last driving stage SRCn is electrically connected to the input terminal IN of the dummy stage DSRC.

The start signal STV is applied to the reset terminal RE of remaining driving stages SRC3~SRCn except for the start driving stage SRC 1 and a second driving stage SRC2 of the driving stages SRC1~SRCn. Thus, the remaining driving stages SRC3~SRCn may be reset by the start signal STV The reset terminal RE of the dummy stage DSRC receives a voltage applied from the OUT terminal of the dummy stage DSRC as will be discussed in more detail below.

As shown in FIG. 1, a wire receiving the start signal STV, e.g., as supplied from an exterior source, is extended to be electrically connected to the control terminal CT of the dummy stage DSRC. In the present exemplary embodiment, since the wire is electrically connected to the reset terminal RE of the remaining driving stages SRC3~SRCn, very little additional wiring is required to apply the start signal STV to the reset terminal RE of the remaining driving stages SRC3~SRCn from the gate driver 100, e.g., only the wiring leading from the start signal wire to the reset terminals RE thereof.

The output terminal OUT of the dummy stage DSRC is electrically connected to the control terminal CT of the last driving stage SRCn and the reset terminal RE of the dummy stage DSRC. The dummy stage DSRC applies a gate signal to the control terminal CT of the last driving stage SRCn to lower a voltage level of the gate signal output from the last driving stage SRCn. In addition, the dummy stage DSRC may be self-reset by its own gate signal, e.g., the dummy gate signal.

Each of the driving stages SRC1~SRCn includes a discharge transistor NT15 connected to second ends of the gate lines GL1~GLn. The discharge transistor NT15 includes a control electrode connected to a next gate line, an input electrode receiving the gate-off voltage Voff, and an output electrode connected to a present gate line. Thus, the discharge transistor NT15 discharges the present gate line to the gate-off voltage Voff in response to the next gate signal output from the subsequent driving stage.

In the present exemplary embodiment, the control electrode of the last discharge transistor NT15, which is configured to discharge the last gate line GLn, is electrically connected to the output terminal OUT of the dummy stage DSRC through the dummy gate line DGL. Accordingly, the last discharge transistor NT15 discharges the last gate line GLn to the gate-off voltage Voff in response to the dummy output signal output from the output terminal OUT of the dummy stage DSRC.

Figure 2:
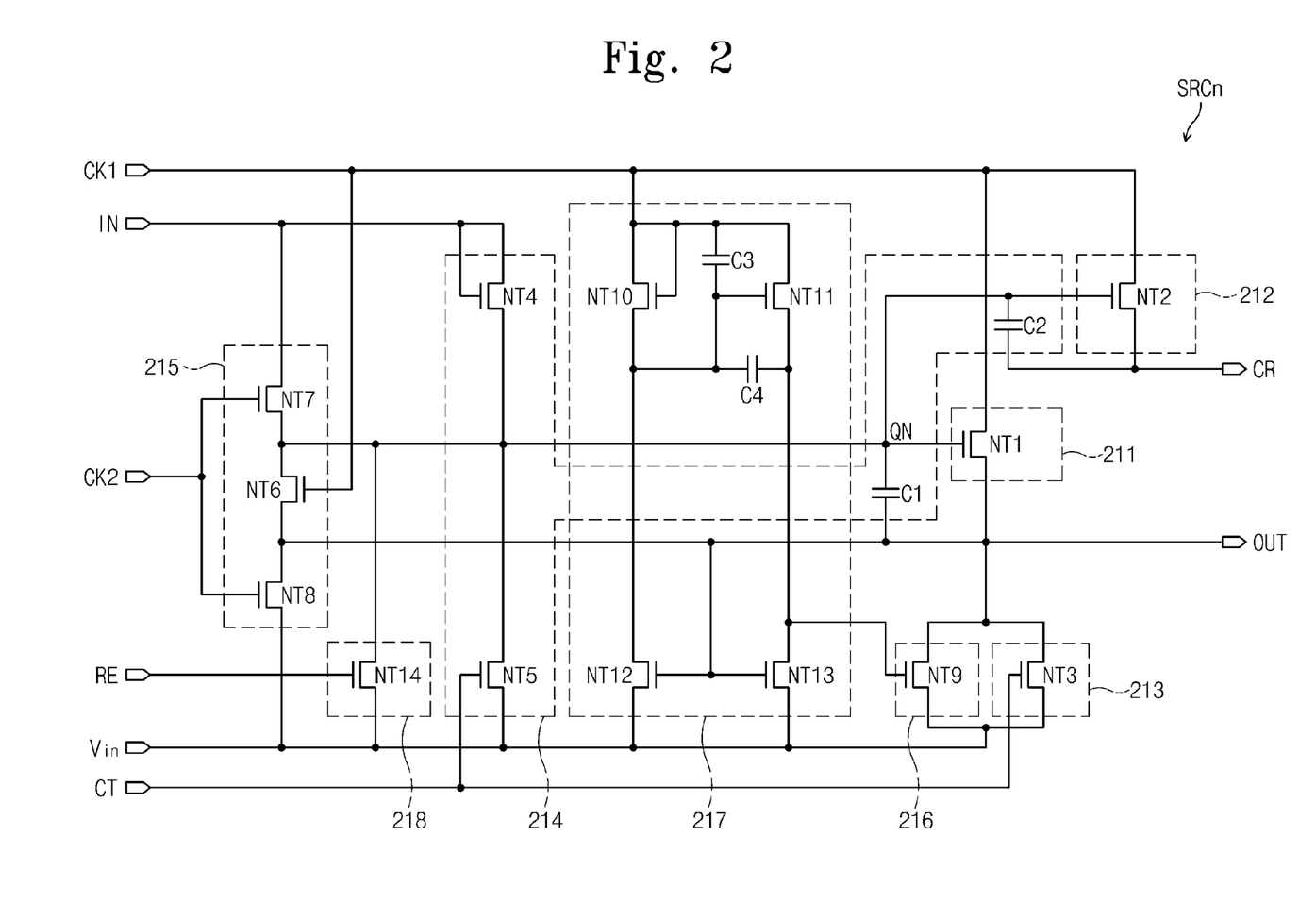
FIG. 2 is an equivalent circuit diagram illustrating an exemplary embodiment of a last driving stage of FIG. 1.

FIG. 2 is an equivalent circuit diagram illustrating a last driving stage of FIG. 1. In FIG. 2, the last driving stage SRCn will be described in detail as a representative example since in the present exemplary embodiment the driving stages of the gate driver have substantially the same circuit configuration and function.

Referring to FIG. 2, the last driving stage SRCn includes a pull-up part 211, a carry part 212, a pull-down part 213, a pull-up driving part 214, a ripple preventing part 215, a holding part 216, an inverter part 217, and a reset part 218.

The pull-up part 211 includes a pull-up transistor NT1 having a control electrode connected to an output (hereinafter, referred to as Q-node "QN") of the pull-up driving part 214, an input electrode connected to the first clock terminal CK1, and an output electrode connected to the output terminal OUT. The pull-up transistor NT1 pulls up the present gate signal output through the output terminal OUT to a high level of the clock (hereinafter, referred to as first clock CKV, see FIGS. 1 and 2) applied through the first clock terminal CK1 in response to the voltage output from the pull-up driving part 214. The pull-up transistor NT1 is turned on during a high period, hereinafter, referred to as a first period, of the first clock CKV within one frame to maintain the present gate signal in a high state during the first period.

The carry part 212 includes a carry transistor NT2 having a control electrode connected to the Q-node QN, an input electrode connected to the first clock terminal CK1, and an output electrode connected to the carry terminal CR. The carry transistor NT2 pulls up a present carry signal output through the carry terminal CR to the high level of the first clock CKV in response to the voltage output from the pull-up driving part 214. The carry transistor NT2 is turned on during the first period within the one frame to maintain the present carry signal in the high state.

The pull-down part 213 includes a pull-down transistor NT3 having a control electrode connected to the control terminal CT, an input electrode connected to the voltage input terminal Vin, and an output electrode connected to the output terminal OUT. The pull-down transistor NT3 pulls down the pulled-up present gate signal to the gate-off voltage Voff (see FIG. 1) applied through the voltage input terminal Vin in response to the next gate signal, or in the case of the last driving stage SRCn, in response to a dummy gate signal to be discussed in more detail below. That is, the pull-down transistor NT3 is turned on by the next gate signal after the first period to pull down the present gate signal to a low state.

The pull-up driving part 214 includes a buffer transistor NT4, a first capacitor C1, a second capacitor C2, and a discharge transistor NT5. The buffer transistor NT4 includes an input electrode and a control electrode that are commonly connected to the input terminal IN, and an output electrode connected to the Q-node QN. The first capacitor C1 is connected between the Q-node QN and the output terminal OUT, and the second capacitor C2 is connected between the control electrode of the carry transistor NT2 and the carry terminal CR. The discharge transistor NT5 includes an input electrode connected to the output electrode of the buffer transistor NT4, a control electrode connected to the control terminal CT, and an output electrode connected to the voltage input terminal Vin.

When the buffer transistor NT4 is turned on in response to the previous carry signal, an electric potential of the Q-node QN increases, so that the pull-up transistor NT1 and the carry transistor NT2 are turned on. When the electric potential of the output terminal OUT and the carry terminal CR increases by the turned-on pull-up transistor NT1 and the turned-on carry transistor NT2, the electric potential of the Q-node QN is boosted up by a potential held by the first and second capacitors C1 and C2. Accordingly, the pull-up transistor NT1 and the carry transistor NT2 are maintained in the turn-on state, so that the present gate signal and the present carry signal may be generated at the high state during the first period of the first clock CKV.

When the discharge transistor NT5 is turned on in response to the next gate signal, electric charges charged in the first capacitor C1 are discharged to the gate-off voltage Voff through the discharge transistor NT5. Thus, the electric potential of the Q-node QN is lowered to the gate-off voltage Voff, thereby turning off the pull-up transistor NT1 and the carry transistor NT2. As a result, the present gate signal in the high state and the carry signal are not output through the output terminal OUT and the carry terminal CR.

The ripple preventing part 215 includes first, second and third ripple preventing transistors NT6, NT7 and NT8 and prevents the present gate signal and the present carry signal from being rippled by the first clock CKV or the second clock CKVB during a second period of the one frame. In the present exemplary embodiment, the second period corresponds to a remaining period of the one frame except the first period, so that the first and second periods combined equal a period of one frame. In one exemplary embodiment, the first period will be significantly shorter than the second period as the time period for applying a gate-on signal to the respective gate line will be shorter than the time period for applying a gate-off signal to the respective gate line.

The first ripple preventing transistor NT6 includes a control electrode connected to the first clock terminal CK1, an input electrode connected to the output terminal OUT, and an output electrode connected to the Q-node QN. The second ripple preventing transistor NT7 includes a control electrode connected to the second clock terminal CK2, an input electrode connected to the input terminal IN, and an output electrode connected to the Q-node QN. The third ripple preventing transistor NT8 includes a control electrode connected to the second clock terminal CK2, an input electrode connected to the output terminal OUT, and an output electrode connected to the voltage input terminal Vin.

The first ripple preventing transistor NT6 applies the present gate signal in the low state, which is output from the output terminal OUT, to the Q-node QN in response to the first clock CKV during the second period. Accordingly, the electric potential of the Q-node QN is maintained in the low state during the high period of the first clock CKV within the second period. Thus, the first ripple preventing transistor NT6 may prevent the pull-up transistor NT1 and the carry transistor NT2 from being turned on during the high period of the first clock CKV within the second period.

During the second period, the second ripple preventing transistor NT7 applies the previous carry signal in the low state provided through the input terminal IN to the Q-node QN in response to the clock, hereinafter, referred to as second clock CKVB, see FIG. 1, applied through the second clock terminal CK2. Thus, the electric potential of the Q-node QN is maintained in the low state during the high period of the second clock CKVB with the second period. As a result, the second ripple preventing transistor NT7 may prevent the pull-up transistor NT1 and the carry transistor NT2 from being turned on during the high period of the second clock CKVB within the second period.

The third ripple preventing transistor NT8 discharges the present gate signal to the gate-off voltage Voff in response to the second clock CKVB. Accordingly, the third ripple preventing transistor NT8 may maintain the present gate signal in the gate-off voltage Voff during the high period of the second clock CKVB within the second period.

The holding part 216 includes a holding transistor NT9 having a control electrode connected to an output of the inverter part 217, an input electrode connected to the voltage input terminal Vin, and an output electrode connected to the output terminal OUT.

The inverter part 217 includes first, second, third and fourth inverter transistors NT10, NT11, NT12 and NT13, a third capacitor C3, and a fourth capacitor C4, to turn on or off the holding transistor NT9. The first inverter transistor NT10 includes an input electrode and a control electrode that are commonly connected to the first clock terminal CK1, and an output electrode connected to an output electrode of the second inverter transistor NT11 through the fourth capacitor C4. The second inverter transistor NT11 includes an input electrode connected to the first clock terminal CK1, a control electrode connected to it's input electrode through the third capacitor C3, and an output electrode connected to the control electrode of the holding transistor NT9. The third inverter transistor NT12 includes an input electrode connected to the output electrode of the first inverter transistor NT10, a control electrode connected to the output terminal OUT, and an output electrode connected to the voltage input terminal Vin. The fourth inverter transistor NT13 includes an input electrode connected to the control electrode of the holding transistor NT9, a control electrode connected to the output terminal OUT, and an output electrode connected to the voltage input terminal Vin.

When the third and fourth inverter transistors NT12 and NT13 are turned on in response to the present gate signal of the high state output through the output terminal OUT, the first clock CKV output from the first and second inverter transistors NT10 and NT11 is discharged to the gate-off voltage Voff by the turned-on third and fourth inverter transistors NT12 and NT13. Thus, the holding transistor NT9 is maintained in the turned-off state during the first period in which the present gate signal is maintained in the high state.

Then, when the present gate signal is transited to the low state in the second period, the third and fourth inverter transistors NT12 and NT13 are turned off. Accordingly, the first clock CKV output from the first and second inverter transistors NT10 and NT11 is applied to the holding transistor NT9, and the holding transistor NT9 is turned on. Consequently, the present gate signal may be held in the gate-off voltage Voff during the high period of the first clock CKV within the second period.

The reset part 218 includes a reset transistor NT14 having a control electrode connected to the reset terminal RE, an input electrode connected to the control electrode of the pull-up transistor NT1 and the Q-node QN, and an output electrode connected to the voltage input terminal Vin.

The reset transistor NT14 discharges the electric potential of the Q-node QN to the gate-off voltage Voff in response to the start signal STV (see FIG. 1) provided though the reset terminal RE thereof. Therefore, the pull-up transistor NT1 and the carry transistor NT2 are turned off in response to the start signal STV As shown in FIG. 1, the start signal STV is applied to the reset terminal RE of the remaining driving stages SRC3~SRCn to lower the electric potential of the Q-node QN, thereby resetting all the driving stages SRC1~SRCn.

In the present exemplary embodiment, the start signal STV is not applied to the reset terminal RE of the start driving stage SRC1 and the second driving stage SRC2 of the driving stages SRC1~SRCn. This will be described in detail with reference to FIG. 3.

Figure 3:
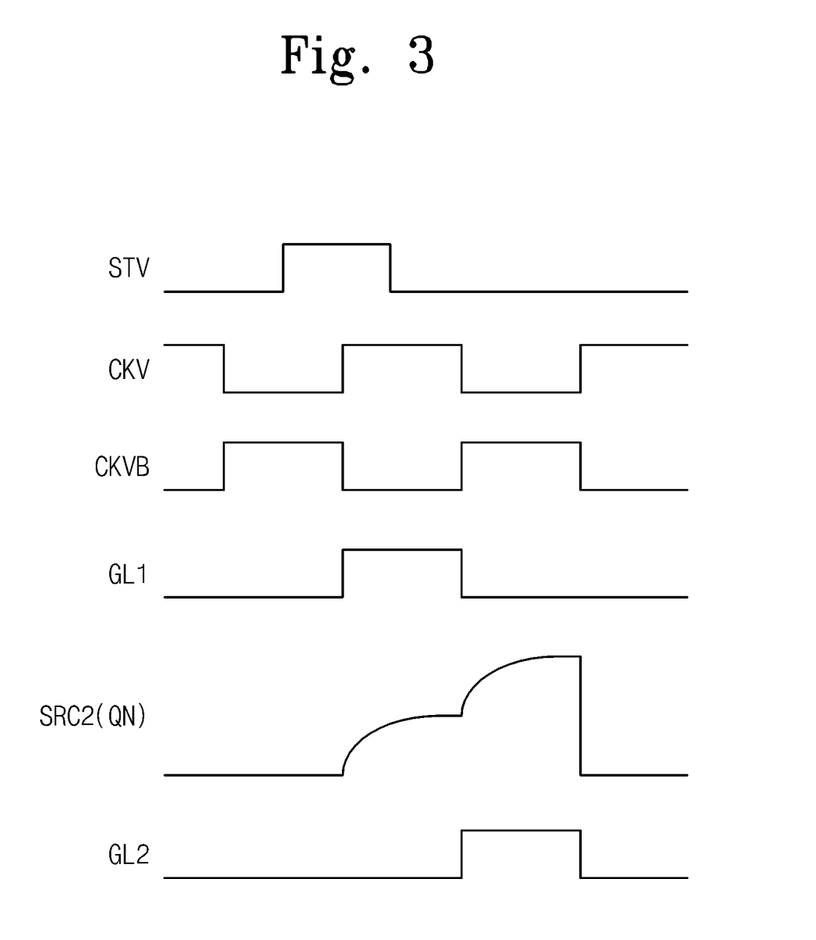
FIG. 3 is a waveform diagram of input/output waveforms of exemplary embodiments of first and second driving stages.

FIG. 3 is a waveform diagram of input/output waveforms of exemplary embodiments of first and second driving stages.

Referring to FIGS. 1 to 3, when the start signal STV is applied to the input terminal IN of the start driving stage SRC1, the pull-up transistor N1 of the start driving stage SRC1 is turned on and the first clock CKV at the high state is output from the output terminal OUT thereof through the pull-up transistor NT1 that is turned on. The signal output from the output terminal OUT of the start driving stage SRC1 is applied to the first gate line GL1 as the gate signal.

Then, the carry signal having substantially the same shape as the gate signal is output from the carry terminal CR of the start driving stage SRC1. The carry signal from the start driving stage SRC1 is applied to the input terminal IN of the second driving stage SRC2, and the electric potential of the Q-node QN of the second driving stage SRC2 increases by the carry signal.

According to the increase of the electric potential of the Q-node QN of the second driving stage SRC2, the pull-up transistor NT1 of the second driving stage SRC2 is turned on and the second clock CKVB at the high state is output from the output terminal OUT through the pull-up transistor NT1 of the second driving stage SRC2. The electric potential of the Q-node QN is boosted up by the first capacitor C1 disposed between the output terminal OUT and the Q-node QN of the second driving stage SRC2.

As described above, a period in which the electric potential of the Q-node QN of the second driving stage SRC2 increases overlaps with the high period of the start signal STV Thus, even if the start signal STV were applied to the reset terminal RE of the second driving stage SRC2, the second driving stage SRC2 would not normally reset. Accordingly, the start signal STV is not applied to the reset terminal REof the start driving stage SRC1 and the reset terminal RE of the second driving stage SRC2.

As shown in FIG. 3, the start signal STV serves to start the operation of the start driving stage SRC1, so that the start signal STV is maintained in the low state during a majority of the time period of one frame. Thus, the remaining driving stages SRC3~SRCn may be reset by using the start signal STV.

Figure 4:
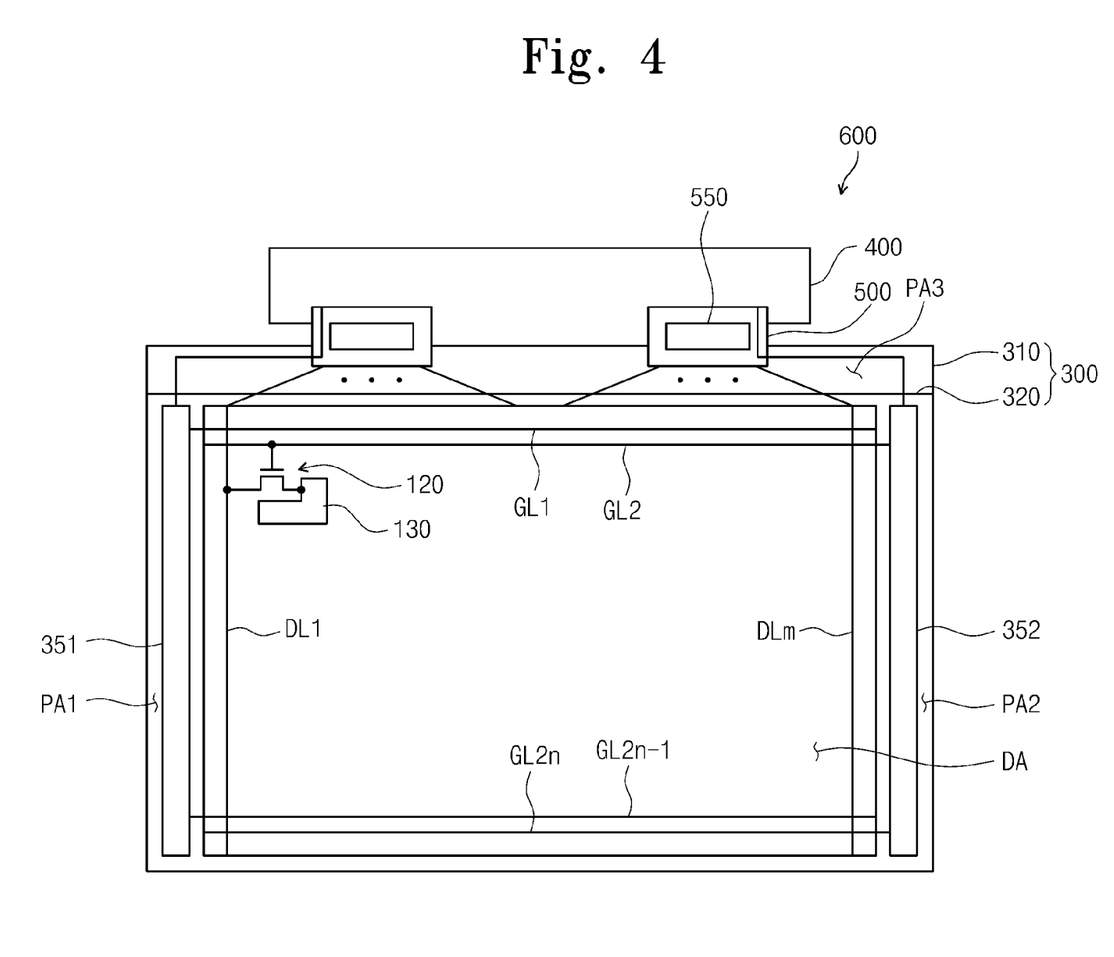
FIG. 4 is a top plan layout view illustrating an exemplary embodiment of a liquid crystal display ("LCD") according to the present invention.

FIG. 4 is a top plan view illustrating an exemplary embodiment of a liquid crystal display ("LCD") according to the present invention.

Referring to FIG. 4, an LCD 600 includes an LCD panel 300 displaying an image, a printed circuit board ("PCB") 400 positioned adjacent to the LCD panel 300, and a tape carrier package ("TCP") 500 electrically connecting the LCD panel 300 and the PCB 400.

The LCD panel 300 includes an array substrate 310, a color filter substrate 320 facing the array substrate 310, and a liquid crystal layer (not shown) interposed between the array substrate 310 and the color filter substrate 320. The array substrate 310 includes a display area DA that displays the image and first, second and third peripheral areas PA1, PA2 and PA3 adjacent to the display area DA. The first peripheral area PA1 is adjacent to first ends of the gate lines GL1~GL2n, and the second peripheral area PA2 is adjacent to second ends of the gate lines GL1~GL2n.

The array substrate 310 includes a plurality of pixels arranged in the display area DA in a matrix form. Particularly, the gate lines GL1~GL2n, the data lines DL1~DLm, a plurality of thin film transistors 120, and pixel electrodes 130 are arranged in the display area DA.

The array substrate 310 includes a gate driver disposed thereon. In one exemplary embodiment, the gate driver may be directly formed on the array substrate through a thin film deposition process. The gate driver includes a first shift register 351 and a second shift register 352. In the present exemplary embodiment, the first shift register 35 1 is arranged in the first peripheral area PA1 to sequentially apply a first gate signal to odd-numbered gate lines GL1, . . . , GL2n-1 of the gate lines GL1~GL2n. Also in the present exemplary embodiment, the second shift register 352 is arranged in the second area PA2 to sequentially apply a second gate signal to even-numbered gate lines GL2, . . . , GL2n of the gate lines GL1~GL2n.

In FIG. 4, the first and second shift registers 351 and 352 are arranged in the first and second peripheral areas PA1 and PA2, respectively, however alternative exemplary embodiments include configurations wherein the first and second shift registers 351 and 352 maybe arranged together in the first peripheral area PA1 or the second peripheral area PA2.

The third peripheral area PA3 is located adjacent to one end of the data lines DL1~DLm and attached with a first end of the TCP 500. A second end of the TCP 500 is attached with the PCB 400. In one exemplary embodiment, the TCP 500 includes a data driving chip 550 mounted thereon to apply a data signal to the data lines DL1~DLm. Thus, the data driving chip 550 may apply the data signal to the data lines DL1~DLm in response to various control signals from the PCB 400.

Also, first and second control signals output from the PCB 400 are applied to the first and second shift registers 351 and 352 through the TCP 500, respectively. Accordingly, the first and second shift registers 351 and 352 may apply the first and second gate signals to the odd-numbered gate lines GL1, . . . , GL2n-1 and even-numbered gate lines GL2, . . . , GL2n, respectively.

In the present exemplary embodiment, the first and second shift registers 351 and 352 have substantially the same structure and function as those of the gate driver 100 shown in FIG. 1, and thus detailed descriptions of the first and second shift registers 351 and 352 will be omitted.

Exemplary embodiments include configurations wherein the first and second shift registers 351 and 352 may receive the same start signal or different start signals. Stages SRC3~SRCn arranged in each of the first and second shift registers 351 and 352 are reset by the start signal STV However, the start signal STV is not applied to the start driving stage SRC1 and the second driving stage SRC2 of each of the first and second shift registers 351 and 352. Meanwhile, since the output terminal OUT of the dummy stage DSRC is electrically connected to the reset terminal RE thereof, the dummy stage DSRC is self-reset.

Although the number of the shift registers arranged in the gate driver increases, the stages arranged in the shift register may be reset by the start signal. The start signal may be of a sufficient voltage that it may be easily applied to a large number of shift registers.

According to the exemplary embodiments of a gate driver and the display apparatus, the stages SRC3~SRCn of the gate driver are reset by using the start signal, so that the output characteristics of the gate driver may be improved.

In addition, the start signal is applied to the reset terminal of each stage using the signal wire through which the start signal is applied to the dummy stage, thereby preventing the need for additional signal wire to be added to the gate driver.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A gate driver that comprises a shift registers, the shift register having only n stages, wherein n is an integer equal to or larger than 1, the n stages consisting of a start stage which corresponds to n=1 and a plurality of subsequent stages which correspond to n=2 to n, respectively;

wherein the start stage outputs a gate signal and starts its operation in response to a start signal; and wherein the plurality of subsequent stages are connected to each other in sequence, and which sequentially output a plurality of gate signals in response to a signal output from the start stage, and wherein the start signal is directly applied to the start stage and applied to the plurality of subsequent stages except for a stage immediately subsequent to the start stage, and the plurality of subsequent stages except for the stage immediately subsequent to the start stage is reset by the start signal.

2. The gate driver of claim 1, wherein each of the plurality of subsequent stages comprises an input terminal which receives a signal output from a previous stage, a control terminal which receives a signal output from a subsequent stage, a reset terminal which receives a reset signal, and an output terminal which outputs the gate signal, and at least one stage of the plurality of subsequent stages receives the start signal as the reset signal through the reset terminal thereof.

3. The gate driver of claim 2, wherein each of the plurality of subsequent stages comprises:

a pull-up part which pulls up the gate signal output through the output terminal;

a pull-up driving part which turns on the pull-up part in response to the signal received through the input terminal and output from the previous stage and turns off the pull-up part in response to the signal applied through the control terminal and output from the subsequent stage;

a pull-down part connected to the control terminal and which pulls down the gate signal in response to the signal output from the subsequent stage; and a reset part connected to the reset terminal and which turns off the pull-up part in response to the reset signal.

4. The gate driver of claim 3, wherein each of the plurality of subsequent stages further comprises:

a carry terminal which outputs a carry signal; and a carry part which pulls up the carry signal output from the carry terminal.

5. The gate driver of claim 4, wherein the signal output from the previous stage serves as the carry signal output from the carry terminal of the previous stage, and the signal output from the subsequent stage serves as a gate signal output from the output terminal of the subsequent stage.

6. The gate driver of claim 2, wherein the start signal is applied to the reset terminal of each of the plurality of subsequent stages except for a stage immediately subsequent to the start stage.

7. The gate driver of claim 2, wherein a dummy stage applies a signal to the control terminal of the last of the plurality of subsequent stages.

8. The gate driver of claim 7, wherein the dummy stage comprises an input terminal which receives a signal output from the last of the plurality of subsequent stages, a control terminal which receives a control signal of the dummy stage, a reset terminal which receives a reset signal of the dummy stage, and an output terminal which outputs a dummy gate signal, and wherein the reset terminal of the dummy stage is connected to the output terminal of the dummy stage and receives the dummy gate signal as the reset signal of the dummy stage.

9. The gate driver of claim 8, wherein the control terminal of the dummy stage receives the start signal as the control signal of the dummy stage.

10. A display apparatus comprising:

a display panel which displays an image, the display panel including a plurality of gate lines, a plurality of data lines, and a plurality of pixels respectively connected to the plurality of gate lines and the plurality of data lines;

a data driver which applies a data signal to the plurality of data lines; and a gate driver which sequentially applies a gate signal to the plurality of gate lines, wherein the gate driver comprises a shift register, the shift register having only n stages, wherein n is an integer equal to or larger than 1, the n stages consisting of a start stage which corresponds to n=1 and a plurality of subsequent stages which correspond to n=2 to n, respectively;

wherein the start stage outputs a gate signal and starts its operation in response to a start signal; and wherein the plurality of subsequent stages are connected to each other in sequence, and which sequentially output the gate signal in response to a signal output from the start stage, wherein at least one stage of the plurality of subsequent stages is reset by the start signal wherein the start is directly applied to the start stage and applied to the plurality of subsequent stages except for a stage immediately subsequent to the start stage, and the plurality of subsequent stage except for the stage immediately subsequent to the start stage is reset by the start signal.

11. The display apparatus of claim 10, wherein each of the plurality of subsequent stages comprises an input terminal which receives a signal output from a previous stage, a control terminal which receives a signal output from a subsequent stage, a reset terminal which receives a reset signal, and an output terminal which outputs the gate signal, and at least one stage of the plurality of subsequent stages receives the start signal as the reset signal through the reset terminal thereof.

12. The display apparatus of claim 11, wherein each of the plurality of subsequent stages comprises:

a pull-up part which pulls up the gate signal output through the output terminal;

a pull-up driving part which turns on the pull-up part in response to the signal received through the input terminal and output from the previous stage and turns off the pull-up part in response to the signal applied through the control terminal and output from the subsequent stage;

a pull-down part connected to the control terminal and which pulls down the gate signal in response to the signal output from the subsequent stage; and a reset part connected to the reset terminal and which turns off the pull-up part in response to the reset signal.

13. The display apparatus of claim 12, wherein each of the plurality of subsequent stages further comprises:

a carry terminal which outputs a carry signal; and a carry part which pulls up the carry signal output from the carry terminal.

14. The display apparatus of claim 13, wherein the signal output from the carry terminal of the previous stage serves as the carry signal output from the carry terminal of previous stage, and the signal output from the subsequent stage serves as the gate signal output from the output terminal of the subsequent stage.

15. The display apparatus of claim 11, wherein the start signal is applied to the reset terminal of each of the plurality of subsequent stages except for a stage immediately subsequent to the start stage.

16. The display apparatus of claim 11, wherein a dummy stage applies a signal to the control terminal of the last of the plurality of subsequent stages.

17. The display apparatus of claim 16, wherein the dummy stage comprises an input terminal which receives a signal output from the last of the plurality of subsequent stages, a control terminal which receives a control signal of the dummy stage, a reset terminal which receives a reset signal of the dummy stage, and an output terminal which outputs a dummy gate signal, and wherein the reset terminal of the dummy stage is connected to the output terminal of the dummy stage and receives the dummy gate signal as the reset signal of the dummy stage.

18. The display apparatus of claim 17, wherein the control terminal of the dummy stage receives the start signal as the control signal of the dummy stage.

19. The display apparatus of claim 10, wherein the gate driver comprises a first shift register and a second shift register, the start stage and the plurality of subsequent stages of the first shift register apply the gate signal to odd-numbered gate lines of the plurality of gate lines, and the start stage and the plurality of subsequent stages of the second shift register apply the gate signal to even-numbered gate lines of the plurality of gate lines.

20. The display apparatus of claim 10, wherein the gate driver is disposed on the display panel through a thin film process.

21. A method of driving a gate driver comprising a shift register, the shift register having only n stages (wherein n is an integer equal to or larger than 1), the n stages consisting of a start stage which corresponds to n=1 and a plurality of subsequent stages which corresponds to n=2 to n, respectively, the method comprising:

driving the start stage which outputs a gate signal and starts its operation in response to a start signal;

driving the plurality of subsequent stages which are connected to each other in sequence, and which sequentially output a plurality of gate signals in response to a signal output from the start stage; and     wherein at least one stage of the plurality of subsequent stages is reset by the start signal     resetting the plurality of subsequent stages except for the stage immediately subsequent to the start stage by the start signal, wherein the start signal is directly applied to the start stage and applied to the plurality of subsequent stages except for a stage immediately subsequent to the start stage.

* * * * *